United States Patent [19]

Chi et al.

[11] Patent Number: 4,987,879

[45] Date of Patent: Jan. 29, 1991

[54] IGNITION DISTRIBUTOR HAVING A MAGNETIC PICK-UP DEVICE INCLUDING A MAGNETORESISTOR

[75] Inventors: Guey-Fa Chi, Hsinchu; Duen-Jen Cheng, Kaohsiung; Ying-Cheun Yeh, Hsinchu, all of Taiwan

[73] Assignee: Industrial Technology Research Institute, Hsinchu, Taiwan

[21] Appl. No.: 520,107

[22] Filed: May 4, 1990

[51] Int. Cl.[5] ........................ F02P 7/067; H01L 43/08

[52] U.S. Cl. ................................ 123/617; 324/207.25; 324/252

[58] Field of Search ................ 123/146.5 A, 414, 617; 324/207.25, 252; 338/32 R

[56] References Cited

U.S. PATENT DOCUMENTS

| | | | |
|---|---|---|---|
| 3,675,636 | 7/1972 | Hini | 123/617 |
| 4,217,874 | 8/1980 | Sohner et al. | 123/617 X |
| 4,335,700 | 6/1982 | Hauler et al. | 123/617 |
| 4,791,365 | 12/1988 | Johannes et al. | 123/617 X |

*Primary Examiner*—Tony M. Argenbright
*Attorney, Agent, or Firm*—Ladas & Parry

[57] ABSTRACT

An ignition distributor of an automotive vehicle has a magnetic pick-up device mounted in the housing of the ignition distributor and including a magnetoresistor. The magnetoresistor is electrically connected to a primary ignition circuit in the ignition coil, which produces a high voltage when said magnetic pick-up device produces a voltage pulse output signal. A permanent magnetic plate is attached to the magnetoresistor and provides a magnetic field perpendicular to the direction of the current flow through the magnetoresistor. When each of the teeth of an armature rotated with the distributor shaft mounted in the ignition distributor passes the magnetic pick-up device to change temporarily the magnetic field applied to the magnetoresistor, the resistance of the magnetoresistor is correspondingly varied so that said magnetoresistor can produce a voltage pulse by the magnetoresistance effect, and open and close the primary ignition circuit for firing the spark plugs.

4 Claims, 4 Drawing Sheets

IGNITION DISTRIBUTOR HAVING A MAGNETIC PICK-UP DEVICE INCLUDING A MAGNETORESISTOR

BACKGROUND OF THE INVENTION

This invention relates to a magnetic pick-up device mounted in an ignition distributor of an automotive vehicle, more particularly to a magnetic pick-up device including a magnetoresistor which produces a voltage pulse caused by the variation of resistance of the magnetoresistor. The magnetic pick-up device senses the positions of the teeth of an armature rotated with the distributor shaft, which represents synchronously the positions of the pistons in the cylinders and produces a voltage pulse for interrupting current flow in the primary winding of the ignition coil so as to fire the spark plugs at the correct time.

Conventionally, the mechanical ignition system and the electronic ignition system are known types used on an internal combustion engine for providing the spark that ignites the combustible air-fuel mixture in the combustion chamber. Each of the mechanical and electronic ignition systems is provided with an ignition distributor which makes and breaks the primary ignition circuit, as well as distributes high tension current to the proper spark plug at the correct time. Referring to FIGS. 1(*a*), 1(*b*), a typical breaker type ignition distributor 10 includes a housing 11, in which the distributor shaft 12 is rotatably mounted. A breaker cam 30 is connected to the distributor shaft 12 and rotated thereby. When the breaker cam 30 rotates, each lobe 31 of the breaker cam 30 passes under the breaker lever rubbing block 40, causing the breaker points 20 to separate, as best illustrated in FIG. 1(*a*). Since the breaker points 20 are connected in series with the primary winding of the ignition coil, current will pass through the circuit when said breaker points 20 are closed. When the breaker points 20 are open, the magnetic field collapses and a high tension voltage is induced in the secondary winding of the ignition coil by the movement of the magnetic field through the coil windings. It is understood that the usual design is to provide one lobe on the breaker cam for each cylinder of the engine. As a result, every revolution of the breaker cam will produce one spark for each cylinder of the engine. After the high tension surge is produced in the ignition coil by the opening of the breaker points, the current passes from the ignition coil to the central terminal of the distributor cap. The current will then jump the minute gap to the distributor cap electrode which, in turn, is connected by high tension wiring to the spark plug designated by the firing order of the engine. However, such a breaker point type ignition distributor suffers from the disadvantage of wearing of the breaker points. Therefore, periodic checks of timing and dwell are necessary.

Referring to FIG. 2, a typical electronic ignition distributor 1000 comprises a distributor shaft 1001 rotatably mounted therein. An armature 2000, with teeth 2001 equally spaced therearound, is connected to the distributor shaft 1001. The positions of the teeth 2001 of the armature 2000 represent synchronously the positions of the pistons of the cylinders. A magnetic pick-up device 5000, which is mounted in the ignition distributor 1000, comprises a permanent magnetic bar 4000 and a pick-up coil 3000 provided around the permanent magnetic bar 4000. As the armature 2000 rotates, each tooth 2001 of the armature 2000 passes over the permanent magnetic bar 4000 of magnetic pick-up device 5000 and through the magnetic field of said permanent magnetic bar 4000, producing an induced electromotive force. Therefore, a voltage pulse will be created in the magnetic pick-up device 5000 each time a tooth 2001 of the armature 2000 passes said magnetic pick-up device 5000. The voltage pulse is then amplified and built up for firing a spark plug at the correct time. The magnetic pick-up device 5000 has replaced the function of the breaker points, and unlike the breaker points, shows no signs of wear. Therefore, periodic checks of timing and dwell are not necessary. Ignition maintenance is reduced to inspection of wiring, and cleaning and replacing of spark plugs as needed. However, the induced electromotive force caused by the induced current flowing in the pick-up coil 3000 will vary due to the low responsiveness of the pick-up coil 3000 when the engine speed is varied from high to low or vice versa. When the engine speed is high, the value of the voltage pulse is large, and when the engine speed is low, the value of the voltage pulse is small. Thus, the output value of voltage pulse is unstable. In addition, the the magnetic pickup device including the permanent magnetic bar 4000 and the pick-up coil 3000 is bulky in size.

SUMMARY OF THE INVENTION

It is therefore a main object of this invention to provide an ignition distributor having a magnetic pickup device mounted therein, which is prevented from wearing and creates a stable pulse even when the engine speed is changed.

It is another object of this invention to provide an ignition distributor having a magnetic pick-up device which is much smaller in size than the conventional magnetic pick-up devices.

A feature of this invention is providing an ignition distributor of an automotive vehicle with a magnetic pick-up device including a magnetoresistor. The magnetoresistor is electrically connected to a primary ignition circuit in the ignition coil, which produces a high tension voltage when said magnetic pick-up device produces a voltage pulse output signal therefrom. The magnetoresistor has a permanent magnetic plate attached thereto which provides a magnetic field vertical to the direction of the current flow through the magnetoresistor. Thereby, when each of the teeth of an armature rotated with the distributor shaft mounted in the ignition distributor passes the magnetic pick-up device to change temporarily the magnetic field applied to the magnetoresistor, the resistance of the magnetoresistor is correspondingly varied so that said magnetoresistor can produce a voltage pulse by the magetoresistance effect thereof, and open and close the primary ignition circuit for firing the spark plugs. Because the voltage pulse is caused by the change of the resistance of the magnetoresistor, which is not affected by the variation of the engine speed, the voltage pulse output signal is stable. Since the teeth of the armature are not in contact with the pick-up device of this invention, there is no wear therebetween. In addition, such a magnetic pick-up device of this invention which includes a magnetoresistor , can be made into a thin plate with small volume and compares favorably in size with the conventional magnetic pick-up device consisting of pick-up coil and permanent magnetic bar.

Another feature of this invention is to provide an ignition distributor having a magnetic pick-up device mounted therein. The magnetic pick-up device includes two magnetoresistors attached to a permanent magnetic plate and are spaced from each other at a predetermined distance. The two magnetoresistors are electrically connected in series to the primary ignition circuit to form a magnetic pick-up device of differential type, so that the variation of the resistivity of the magnetoresistor, which is caused by the variation of temperature, can be eliminated.

BRIEF DESCRIPTION OF THE DRAWINGS

Other features and advantages of this invention will become apparent in the following detailed description of the preferred embodiments of this invention with reference to the accompanying drawings, in which:

FIG. 3(*b*) is an enlarged schematic view showing a tooth of the armature passing the magnetic pick-up device of FIG. 3(*a*) according to this invention;

FIG. 5(*b*) is an enlarged schematic view showing a tooth of the armature passing the magnetic pick-up device shown in FIG. 5(*a*) according to this invention.

DETAILED DESCRIPTION OF THE PREFERRED EMBODIMENTS

Figure 1A:
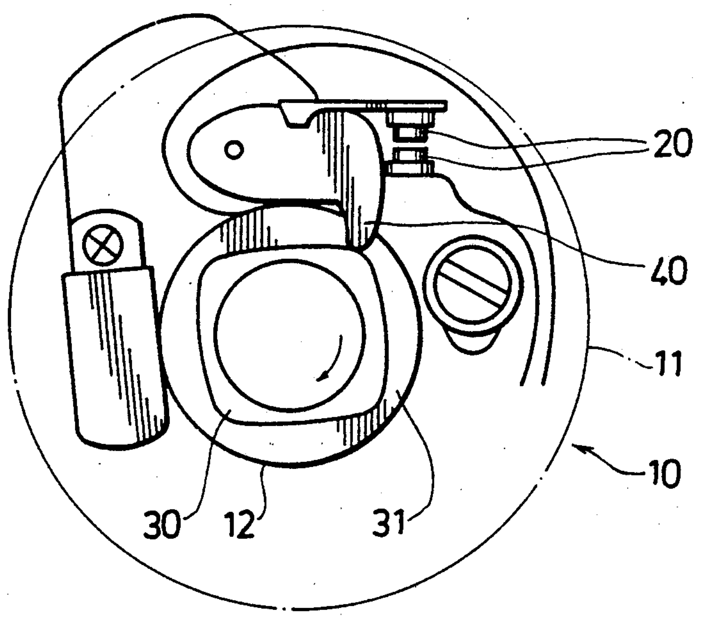
F I G. 1(a) PRIOR ART
FIGS. 1(*a*), 1(*b*) are schematic top views of a conventional breaker type ignition distributor.
Figure 1B:
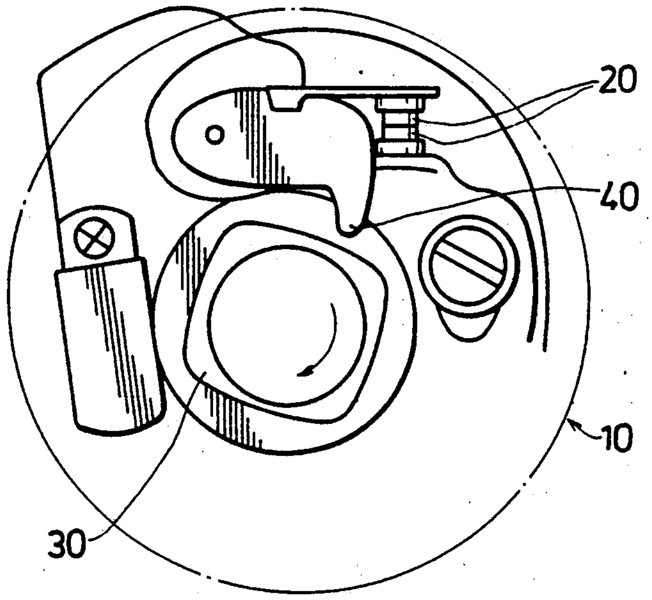
F I G.1(b) PRIOR ART
Figure 2:
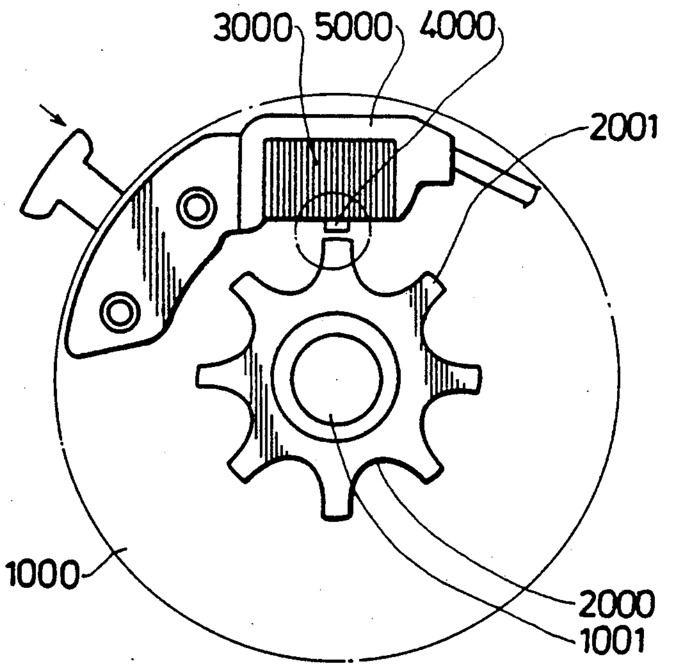
F I G. 2 PRIOR ART
FIG. 2 is a schematic elevational view of a conventional electronic ignition distributor.
Figure 3A:
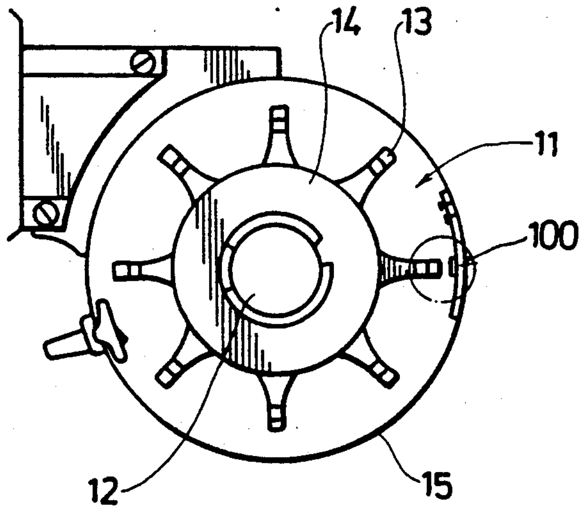
FIG. 3(*a*) is an elevational view of a preferred embodiment of a distributor having a magnetic pick-up device of this invention.
Figure 3B:
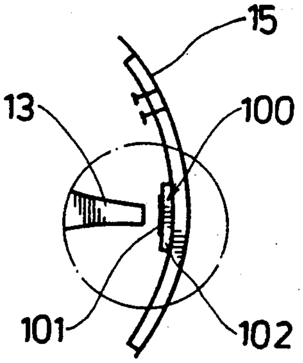

Referring to FIGS. 3(*a*), 3(*b*), a preferred embodiment of an ignition distributor 11 of an automotive vehicle having a magnetic pick-up device 100 mounted therein is shown. The ignition distributor 11 has a housing 15 and a distributor shaft 12 rotatably mounted therein. An armature 14 is rotated with the distributor shaft 12. The armature 14 has a plurality of teeth 13 equally spaced therearound. The positions of the teeth 13 of the armature 14 represent synchronously the positions of the pistons in the cylinders. The magnetic pick-up device 100 includes a piece of magnetoresistor 101 and a permanent magnetic plate 102 attached to the magnetoresistor. The magnetic pick-up device 100 is fixed to the inner face of the housing 15 of the ignition distributor 11. The magnetoresistor 101 is electrically connected to a primary ignition circuit in the ignition coil (not shown), which produces a high tension voltage when said magnetic pick-up device 100 produces a voltage pulse output signal therefrom. The permanent magnetic plate 102 provides a magnetic field vertical to the direction of the current flowing through the magnetoresistor 101. In this way, when the distributor shaft 12 is rotated and a tooth 13 passes the magnetic pick-up device 100, the magnetic field applied to the magnetoresistor 101 will be temporarily changed.

Figure 4:
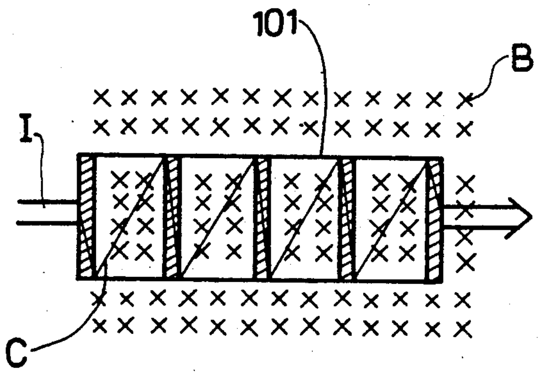
FIG. 4 is a schematic view of a magnetoresistor which is piecewisely provided with Hall-voltage shorting strips, having a magnetic field applied thereto and a current passed therethrough according to this invention.

The fabrication of the magnetoresistor 101 of this invention, which is preferably provided piecewisely with Hall-voltage shorting strips to short the Hall voltage produced in the magnetoresistor 101, can be best understood with reference to an article entitled "FABRICATION OF HIGH SENSITIVITY THIN-FILM INDIUM ANTIMONIDE MAGNETORESISTORS," published in Solid-State Electronics, 1975, vol. 18, pp. 393–397; and an article entitled "A TECHNIQUE TO IMPROVE THE SENSITIVITY OF THIN FILM InSb MAGNETORESISTORS," published in Thin Solid Film, vol. 87, 1982, pp. 17–21. It is known that when a magnetic field (B) is increased and applied to the magnetoresistor 101 in a direction perpendicular to the direction of current (I) flowing through the magnetoresistor 101, the path along which current carrier (C) moves in the magnetoresistor 101 will be increased; and when the magnetic field (B) is decreased, said path will be decreased, as shown in FIG. 4. That is, when the magnetic field applied to the magnetoresistor 101 is increased, the resistance of the magnetoresistor 101 will be increased; and when said magnetic field is decreased, the resistance of the magnetoresistor 101 will be decreased.

When each of the teeth 13 of the armature 14 is approaching the magnetic pick-up device 100, the magnetic field applied to the magnetoresistor 101 is increased, and when each of the teeth 13 is moving away from the magnetic pick-up device, the magnetic field applied to the magnetoresistor 101 is decreased. That is, each time a tooth 13 of the armature 14 passes the magnetic pick-up device 100, the resistance of the magnetoresistor 101 will be increased and then decreased, thus producing a voltage pulse to open and close the primary ignition circuit in the ignition coil for firing the spark plugs. Therefore, the spark plugs can be fired at the correct time in accordance with the positions of the teeth 13 of the armature 14 in the distributor 11, which represent synchronously the positions of the pistons in the cylinders.

Figure 5A:
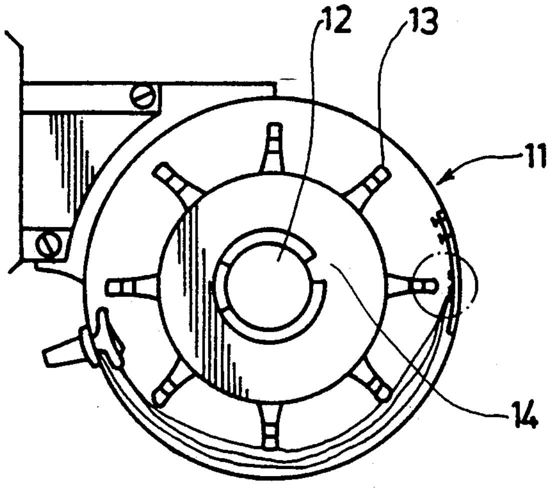
FIG. 5(*a*) is an elevational view of another preferred embodiment of a distributor having a magnetic pick-up device of this invention.
Figure 5B:
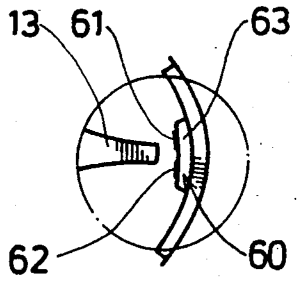
Figure 6:
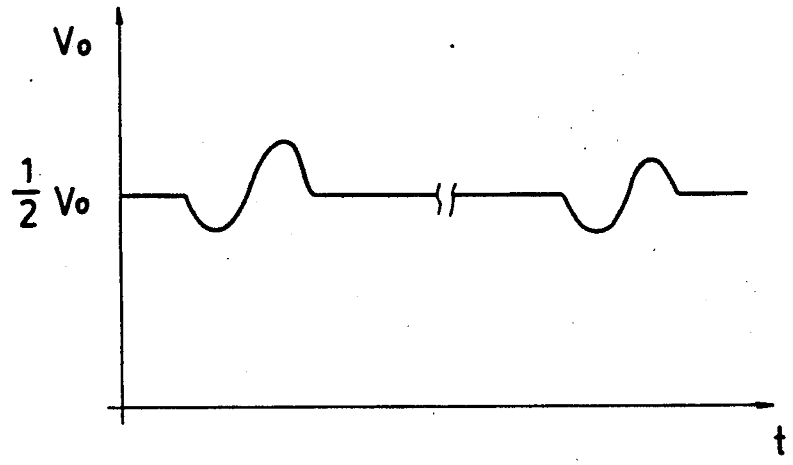
FIG. 6 is a diagram showing the relationship between the output voltage produced from the magnetic pick-up device shown in FIG. 5(*a*) and the time.

Referring to FIGS. 5(*a*), 5(*b*), another preferred embodiment of an ignition distributor having a magnetic pick-up device 60 mounted therein according to this invention is shown. In this embodiment, the magnetic pick-up device 60 is mounted in the ignition distributor, similar to the above mentioned embodiment. The magnetic pick-up device 60 includes a first and a second magnetoresistor 61, 62 attached to a permanent magnetic plate 63 and are spaced from each other at a distance of about 0.1 to 5 mm. The magnetoresistors 61, 62 are made of the same semiconductor material. The two magnetoresistors 61, 62 are electrically connected in series to the primary ignition circuit of the ignition coil to form a magnetic pick-up device of differential type, so that the variation of the resistivity of the magnetoresistors, which is caused by the variation of the temperature, can be eliminated. Because the first and the second magnetoresistors 61, 62 are connected in series, the input voltage Vi and the output voltage Vo of the magnetic pick-up device 60 has the following relationship:

$$Vo = \frac{R2}{R1 + R2} Vi$$

wherein R1, R2 are the resistance of the first and second magnetoresistors respectively. When a tooth 13 is moved close to magnetoresistor 61, R1 is increased and therefore, output voltage Vo is decreased. Next, when a tooth 13 is moved away from the magnetoresistor 61 and close to magnetoresistor 62, R1 is decreased and the resistance R2 of magnetoresistor 62 is increased and therefore, Vo is increased. When said tooth 13 is moved away from magnetoresistor 62, R2 is decreased and therefore, Vo is decreased, as best illustrated in FIG. 6. In this way, a voltage pulse is produced from the magnetic pick-up device 60 to close and open the primary ignition circuit of the ignition coil for firing the spark plugs.

Because the voltage pulse created by the magnetic pick-up device of this invention is caused by the change of the resistance of the magnetoresistor, which is not affected by the variation of the engine speed, the voltage pulse output signal is stable. Since the teeth 13 of the armature 14 in the distributor are not in contact with the pick-up device of this invention, there is no wear therebetween. In addition, the magnetoresistor is made into a thin film and fixed to the permanent magnetic plate in accordance with this invention, so that the size of the magnetic pick-up device can be favorably reduced and smaller in comparison with the conventional magnetic pick-up device consisting of pick-up coil and permanent magnetic bar.

With this invention thus explained, it is apparent that numerous modifications and variations can be made without departing from the scope and spirit of this invention. It is therefore intended that this invention be limited only as indicated in the appended claims.

We claim:

1. An ignition distributor comprising a housing, a distributor shaft rotatably mounted therein, an armature connected to said distributor shaft and having a predetermined number of teeth equally spaced therearound, and a magnetic pick-up device fixed to an inner face of said housing facing said teeth of said armature, said magnetic pick-up device producing a voltage pulse when said distributor shaft is rotated and each of said teeth of said armature passes said magnetic pick-up device for closing and opening a primary ignition circuit of an ignition coil which is electrically connected to said magnetic pick-up device, wherein the improvements comprise said magnetic pick-up device including a magnetoresistor and a permanent magnetic plate attached to said magnetoresistor, said magnetoresistor being electrically connected in series with said primary ignition of said ignition coil, and having a current flowing therethrough in a first direction, said permanent magnetic plate applying to said magnetoresistor a magnetic field in a second direction perpendicular to said first direction.

2. An ignition distributor as claimed in claim 1, wherein said magnetoresistor is piecewisely provided with Hall-voltage shorting strips.

3. An ignition distributor as claimed in claim 1, wherein said magnetoresistor consists of a first and a second magnetoresistor connected in series with said primary ignition circuit and spaced from each other at a predetermined distance.

4. An ignition distributor as claimed in claim 3, wherein said first and second magnetoresistors are made of the same semiconductor material

* * * * *